(12) United States Patent
Rennie et al.

(10) Patent No.: US 8,760,912 B2
(45) Date of Patent: *Jun. 24, 2014

(54) EIGHT TRANSISTOR SOFT ERROR ROBUST STORAGE CELL

(71) Applicant: Tiraboschi Services, LLC, Dover (DE)

(72) Inventors: David Rennie, Waterloo (CA); Manoj Sachdev, Waterloo (CA)

(73) Assignee: Tiraboschi Services, LLC, Dover, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/751,763

(22) Filed: Jan. 28, 2013

(65) Prior Publication Data

US 2013/0265819 A1    Oct. 10, 2013

Related U.S. Application Data

(63) Continuation of application No. 12/630,947, filed on Dec. 4, 2009, now Pat. No. 8,363,455.

(60) Provisional application No. 61/193,503, filed on Dec. 4, 2008.

(51) Int. Cl.
*G11C 11/00* (2006.01)

(52) U.S. Cl.
USPC .......................................... 365/156; 365/154

(58) Field of Classification Search
USPC .......................................................... 365/156
See application file for complete search history.

(56) References Cited

U.S. PATENT DOCUMENTS

| | | | |
|---|---|---|---|
| 5,111,429 A | 5/1992 | Whitaker |
| 5,157,625 A | 10/1992 | Barry |
| 5,216,630 A | 6/1993 | Nakase |
| 5,311,070 A | 5/1994 | Dooley |
| 5,338,963 A | 8/1994 | Klaasen et al. |
| 5,684,735 A | 11/1997 | Kim |
| 5,805,496 A | 9/1998 | Batson et al. |
| 5,838,606 A | 11/1998 | Blankenship et al. |
| 5,923,593 A | 7/1999 | Hsu et al. |
| 6,058,041 A | 5/2000 | Golke et al. |
| 6,208,554 B1 | 3/2001 | Phan et al. |
| 6,373,745 B2 | 4/2002 | Saito et al. |
| 6,628,551 B2 | 9/2003 | Jain |
| 6,654,275 B2 | 11/2003 | Forbes |
| 6,711,051 B1 | 3/2004 | Poplevine et al. |
| 6,738,283 B2 | 5/2004 | Kasai et al. |
| 6,751,111 B2 | 6/2004 | Foss et al. |
| 6,807,081 B2 | 10/2004 | Nii |

(Continued)

*Primary Examiner* — Son Mai
(74) *Attorney, Agent, or Firm* — McAndrews, Held & Malloy, Ltd.

(57) ABSTRACT

A storage cell is provided with improved robustness to soft errors. The storage cell comprises complementary core storage nodes and complementary outer storage nodes. The outer storage nodes act to limit feedback between the core storage nodes and are capable of restoring the logical state of the core storage nodes in the event of a soft error. Similarly the core storage nodes act to limit feedback between the outer storage nodes with the same effect. This cell has advantages compared with other robust storage cells in that there are only two paths between the supply voltage and ground which limits the leakage power. An SRAM cell utilizing the proposed storage cell can be realized with two access transistors configured to selectively couple complementary storage nodes to a corresponding bitline. A flip-flop can be realized with a variety of transfer gates which selectively couple data into the proposed storage cell.

25 Claims, 13 Drawing Sheets

(56) References Cited

U.S. PATENT DOCUMENTS

| | | |
|---|---|---|
| 7,009,871 B1 | 3/2006 | Kawasumi |
| 7,088,606 B2 | 8/2006 | Turner |
| 7,088,607 B2 | 8/2006 | Matsuzawa et al. |
| 7,492,628 B2 | 2/2009 | Chuang et al. |
| 7,613,067 B2 | 11/2009 | Sachdev et al. |
| 7,643,329 B2 | 1/2010 | Sacheve et al. |
| 7,656,702 B2 | 2/2010 | Wijeratne et al. |
| 7,733,688 B2 | 6/2010 | Giraud et al. |
| 7,764,535 B2 | 7/2010 | Nguyen |
| 7,876,602 B2 | 1/2011 | Lawrence et al. |
| 8,363,455 B2 * | 1/2013 | Rennie et al. .................. 365/156 |
| 2006/0187700 A1 | 8/2006 | Ho |

* cited by examiner

EIGHT TRANSISTOR SOFT ERROR ROBUST STORAGE CELL

The proposed Eight Transistor Storage Cell topology offers improved soft error robustness compared to the standard dual-inverter storage cell commonly used in 6T SRAM cells and static flip-flops. Compared with previously described soft error robust storage cells this topology allows smaller cells and reduced leakage power. This application claims the benefit of priority of U.S. Provisional Patent Application No. 61/193,503 filed Dec. 4, 2008 and is a continuation of U.S. patent application Ser. No. 12/630,947 filed on Dec. 4, 2009 and issued as U.S. Pat. No. 8,363,455, both of which are incorporated herein by reference in their entireties.

BACKGROUND OF THE INVENTION

SRAMs are one of the most popular ways to store data in electronic systems. Similarly, embedded SRAMs are a vital building block in integrated circuits. SRAMs are a preferred method of implementing embedded memories owing to higher speed, robust design, and ease of integration. SRAMs, in general, occupy a significantly large portion of the chip's die area, making it an important block in terms of area, yield, reliability and power consumption. With increasing demand for highly integrated System on Chip (SoC), improving various aspects of embedded SRAMs have received a significant interest.

The six transistor SRAM cell is the most popular configuration because of its high speed and robustness. However the 6T SRAM cell, shown in FIG. 1, suffers from a relatively high vulnerability to soft errors. At the heart of the 6T SRAM cell is the four transistor dual-inverter storage cell shown in FIG. 2. The inherent feedback of the back-to-back inverters means that if sufficient charge is collected on one node, the feedback will cause the second node to also switch. This results in an erroneous state being stored, and the cell cannot recover.

Flip-flops are critical components in integrated circuits. Flip-flops enable sequential logic by storing the result of combinational logic. A flip-flop stores data by sampling the input data signal with a clock signal at a particular instant of time, typically at the edge of the clock. Thus, the output of the flip-flop is sensitive to the input data signal only at the clock edge. At all other times, the flip-flop's output is constant and does not respond to changes in input data signal.

A flip-flop can be realized in a variety of ways. A typical way of realizing a flip-flop is to use two series connected latches called master and slave. This architecture of flip-flop is called the master-slave D-flip-flop (DFF), a schematic of which is given in FIG. 3. Whatever the architecture every flip-flop must have a storage element. Most static flip-flops use a dual-inverter structure, shown in FIG. 2.

The scaling of CMOS processes has resulted in lower node capacitance and lower supply voltages in integrated circuits. The result of these effects is that less charge is used to store data in a storage cell. The increased density enabled by the smaller geometries of scaled processes has also enabled the integration of large SRAM arrays and large numbers of flip-flops. These conditions resulted in an increased sensitivity to transients induced by ionizing radiation consisting of energetic cosmic neutrons and alpha particles. When these particles strike the chip they generate a large number of electron hole pairs. Depending on the location of the particle strike the deposited charge may be collected by a node in a storage cell. If sufficient charge is collected the storage cell can switch its logical state, which is called a soft error. In view of this vulnerability numerous methods have been proposed to improve the robustness of the storage cell. More effort has been put into improving the soft-error robustness of SRAM cells, however the SER of flip-flops has been continually degrading to the point where is has become a significant reliability consideration. Both the 6T SRAM and the master-slave static CMOS DFF use the dual-inverter storage cell to hold a logical state. For both circuits the data value stored in this structure can be susceptible to soft errors. If a soft error transient is able to change the state of one node, the feedback of the dual-inverter storage cell will change the second node and result in erroneous data being stored.

FIG. 4 shows the schematic diagram of an SRAM cell which has an improved robustness to radiation induced soft errors. In the proposed circuit the SRAM cell has the same dual-inverter storage cell as in the traditional case, however it also includes a coupling capacitor between the two nodes where the data is stored. The effect of adding the coupling capacitor is that the critical charge ($Q_c$) of the cell is significantly increased. The critical charge is the minimum amount of charge which will result in a soft error. However, the addition of a large, area efficient coupling capacitor requires a special semiconductor manufacturing process. Therefore this SRAM cell is not easily integrated into common Complementary Metal-Oxide-Semiconductor (CMOS) processes. As a result, for Application Specific Integrated Circuits (ASICs) where embedded SRAM cells are widely realized using standard CMOS process, this approach is costly to implement. Another problem with this approach is that while the capacitor increases the critical charge, it also makes the cell slower to write to. For data to be written into this SRAM cell the coupling capacitor will have to be charged/discharged, which will take more time than for a standard 6T SRAM cell. This results in a lower frequency of operation, which is again not desirable. Another drawback of this cell is that the extra capacitance which must be charged and discharged results in larger power consumption compared to the standard 6T SRAM cell.

FIG. 5 shows the schematic diagram of a storage cell which has four extra transistors in order to improve its robustness to soft errors. This circuit is known as the DICE cell, which stands for dual-interlocking storage cell. In the proposed solution, the data is stored on multiple nodes and the storage cell is immune to single node upsets. However, the SRAM cell based on the DICE storage cell requires twice as many transistors to implement compared with the standard 6T SRAM circuit, making it expensive. Also, in order for this cell to be used in a flip-flop, at least three nodes must be accessed. The result is that flip-flops which implement this storage cell require a greater number of transistors and use more power.

FIG. 6 shows the schematic diagram of a third storage cell which has an improved robustness to soft errors. This circuit consists of eight transistors and is similar to the DICE cell in that data is stored at multiple nodes. However, in this storage cell data is stored on four nodes which are interconnected using four half-latches. This SRAM cell is almost completely immune to soft-error induced upsets. The SRAM circuit based on this storage cell requires only ten transistors, which is more than the 6T SRAM cell, but less than the DICE SRAM cell. This storage cell can also be used to implement flip-flops. This data on this storage cell can be changed by accessing only two nodes, and as such fewer transistors are required as compared to the DICE based flip-flop.

SUMMARY OF THE INVENTION

A new storage cell configuration is introduced. The storage cell configuration allows for logical states to be stored with robustness against noise events such as soft errors. Various types of circuits can be implemented with this storage cell, including SRAM cells and flip-flops.

BRIEF DESCRIPTION OF THE DRAWINGS

An embodiment of the present invention will now be described by way of example only with reference to the following drawings in which.

DETAILED DESCRIPTION OF THE PREFERRED EMBODIMENTS

For convenience, like structures in drawings will be referenced by like numerals in the description. The following describes an eight transistor storage cell.

Figure 1:
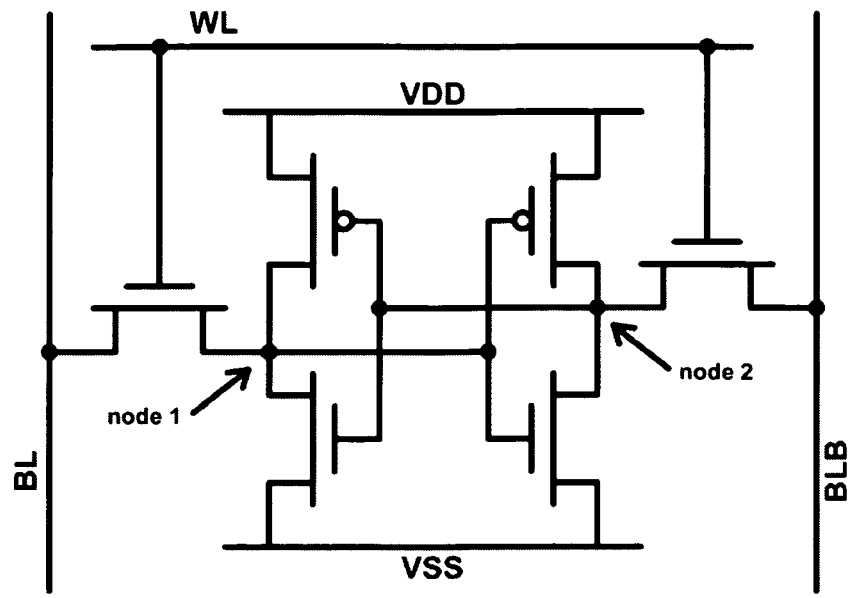
FIG. 1: Schematic showing the prior art of the six transistor SRAM cell.
Figure 2:
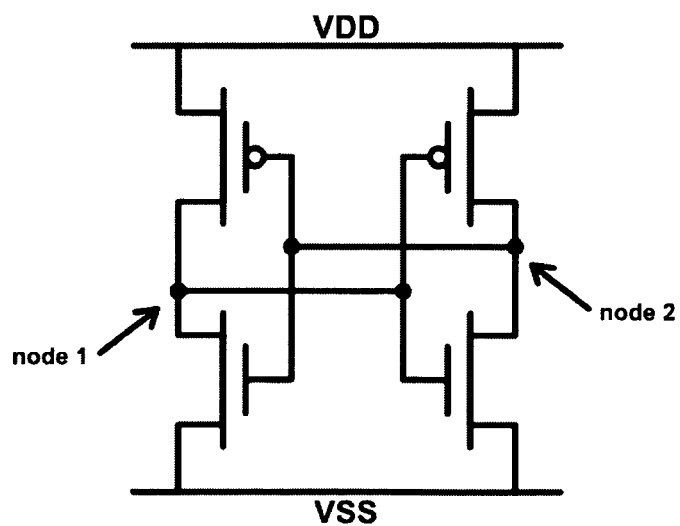
FIG. 2: Schematic showing the prior art of the dual-inverter storage cell.
Figure 3:
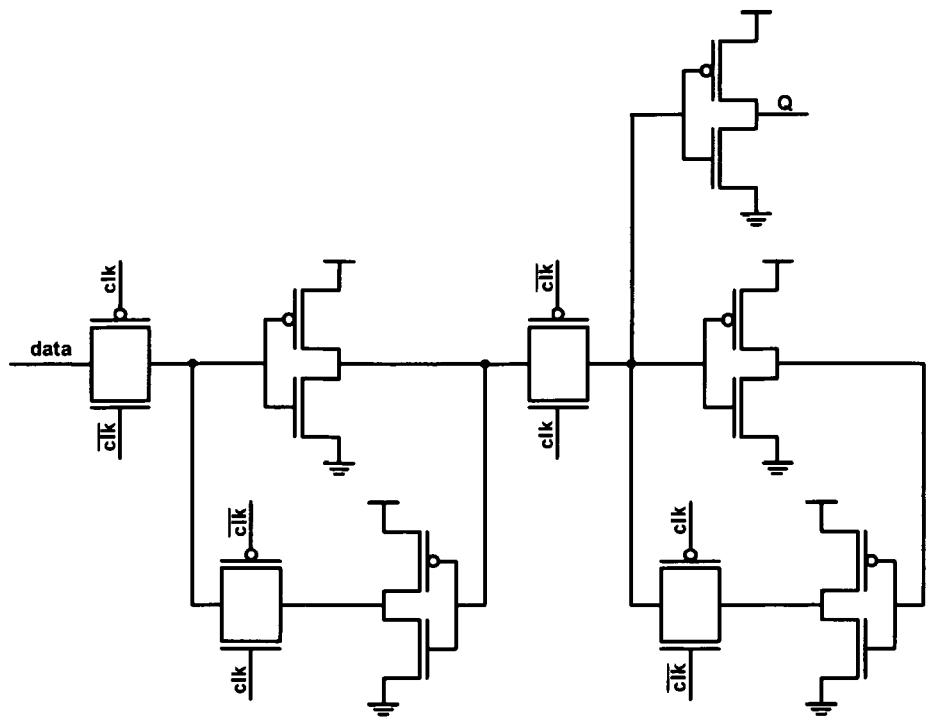
FIG. 3: Schematic showing the prior art of a static CMOS MS DFF.
Figure 4:
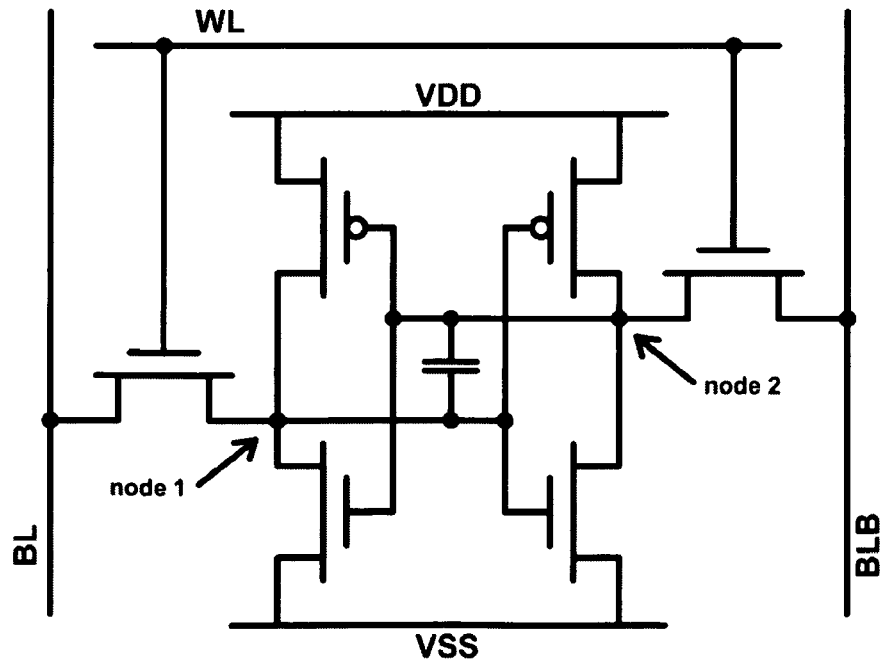
FIG. 4: Schematic showing the prior art of a six transistor SRAM cell with improved SER robustness.
Figure 5:
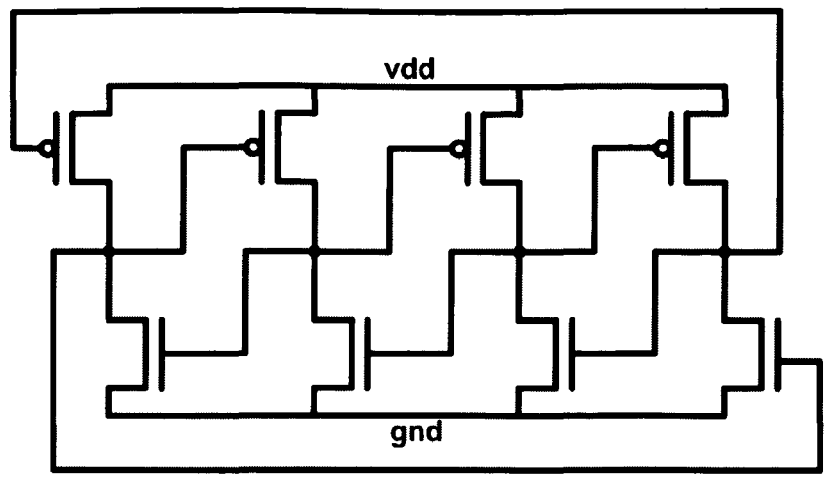
FIG. 5: Schematic showing the prior art of an 8T SER robust DICE storage cell.
Figure 6:
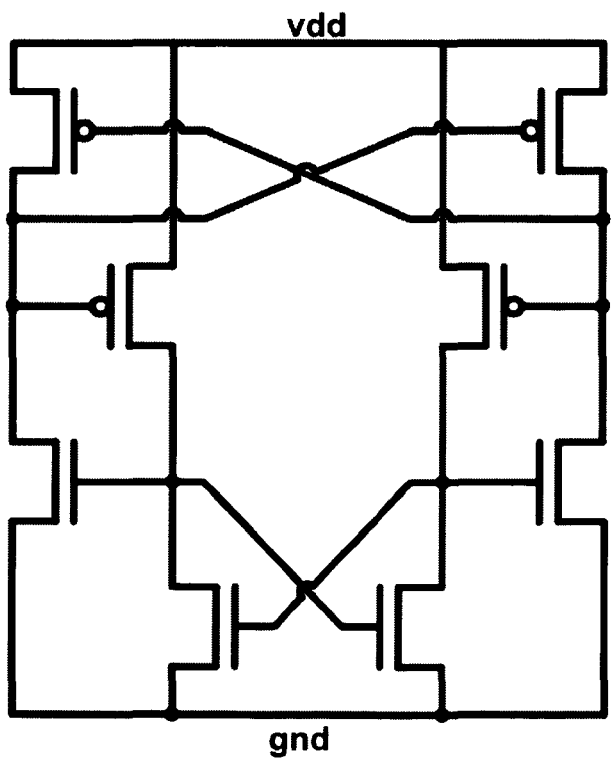
FIG. 6: Schematic showing the prior art of an 8T SER robust storage cell.
Figure 7:
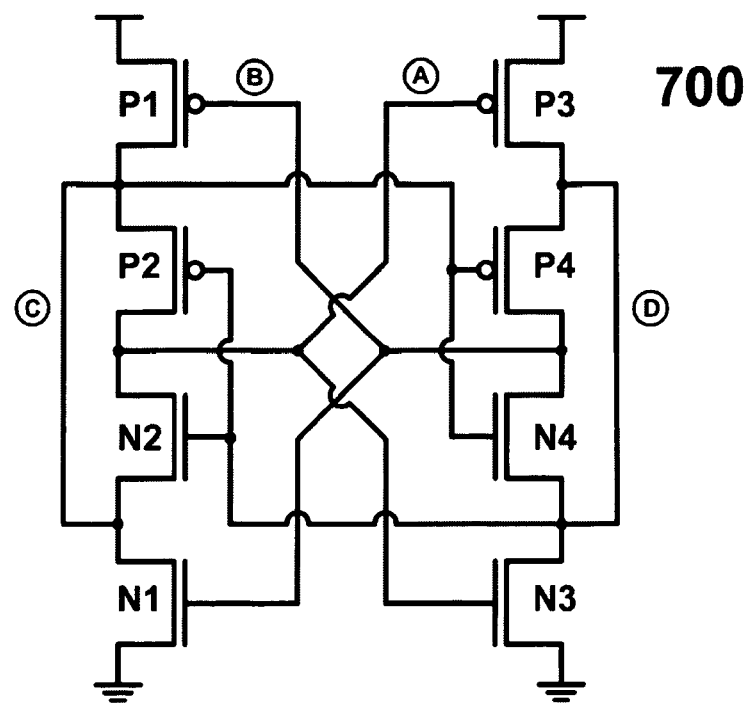
FIG. 7: Schematic diagram showing the architecture of the proposed storage cell.

Referring to FIG. 7, an eight transistor storage cell in accordance with an embodiment of the present invention is illustrated generally by the numeral 700. The eight transistor storage cell 700 comprises four n-channel transistors N1, N2, N3 and N4 (known as drive transistors), four p-channel transistors P1, P2, P3 and P4 (known as load transistors) and four internal nodes A, B, C and D. Transistors N2, N4, P2 and P4 are given the name of core transistors. Transistors N1, N3, P1 and P3 are given the name of outer transistors. Nodes A and B are located at the drains of the core transistors and nodes C and D are located at the drains of the outer transistors.

Figure 8:
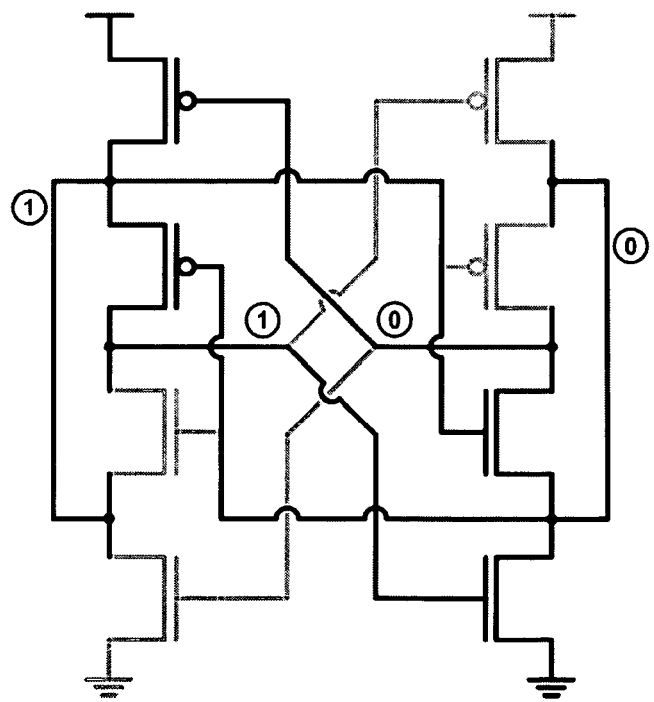
FIG. 8: Proposed storage cell storing 1010.

In the storage cell 700 one logical value will be stored on nodes A and C and a complementary logical value will be stored on nodes B and D. Referring to FIG. 8 the storage cell 700 is illustrated storing a logical 1 on nodes A and C and a logical 0 on nodes B and D.

Transistors N1, N2, N3, N4, P1, P2, P3 and P4 in the storage cell 700 are connected in such a way that the four storage nodes A, B, C, D interlock in such a way so as to work against a change in the state of the storage cell due to a single ended disturbance such as a soft error. The drains of the core transistors N2 and P2 are connected together. The drains of the core transistors N4 and P4 are connected together. The drains of the outer transistors N1 and P1 are connected together. The drains of the core transistors N3 and P3 are connected together. The gates of the core transistors N2 and P2 are connected to the drains of the complementary outer transistors N3 and P3. The gates of the core transistors N4 and P4 are connected to the drains of the complementary outer transistors N1 and P1. The gates of the outer transistors N1 and P1 are connected to the drains of the complementary core transistors N4 and P4. The gates of the core transistors N3 and P3 are connected to the drains of the complementary outer transistors N2 and P2.

The outer transistors of the storage cell 700 selectively connect the storage cell to the supply voltages. The sources of the outer transistors are connected to either the logical high supply voltage VDD or the logical low supply voltage GND. The sources of the outer load transistors P1 and P3 are connected to VDD and the sources of the outer drive transistors N1 and N3 are connected to GND.

Therefore, the storage cell 700 is able to retain logic data as long as it is powered.

Figure 9:
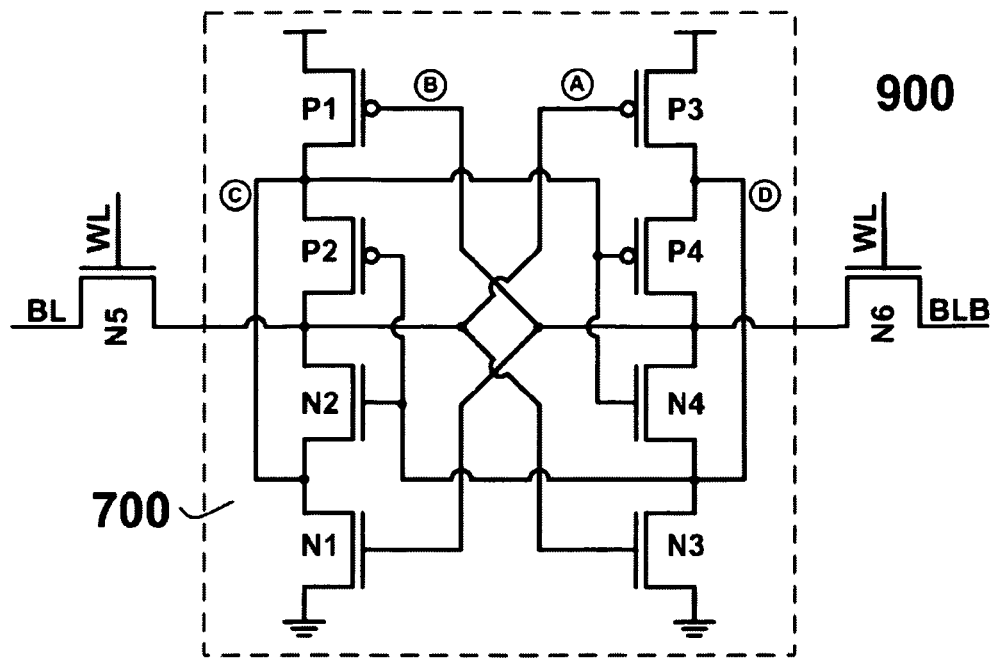
FIG. 9: SER robust SRAM cell utilizing the proposed storage cell.

Referring to FIG. 9, a sample SRAM cell which utilizes the storage cell 700 is illustrated generally by numeral 900. Two NMOS transistors N5 and N6 are added in order to selectively couple the storage cell 700 to bitlines BL and BLB. Transistors N5 and N6 are called access transistors. The gates of the access transistors are couples at their gates to a wordline WL node. The drains of access transistors N5 and N6 are coupled to bitlines BL and BLB respectively. The sources of the access transistors N5 and N6 coupled to nodes A and B of the storage cell 700. The nodes WL, BL and BLB are controlled in order to enable read and write operations on the SRAM cell 900.

Figure 10:
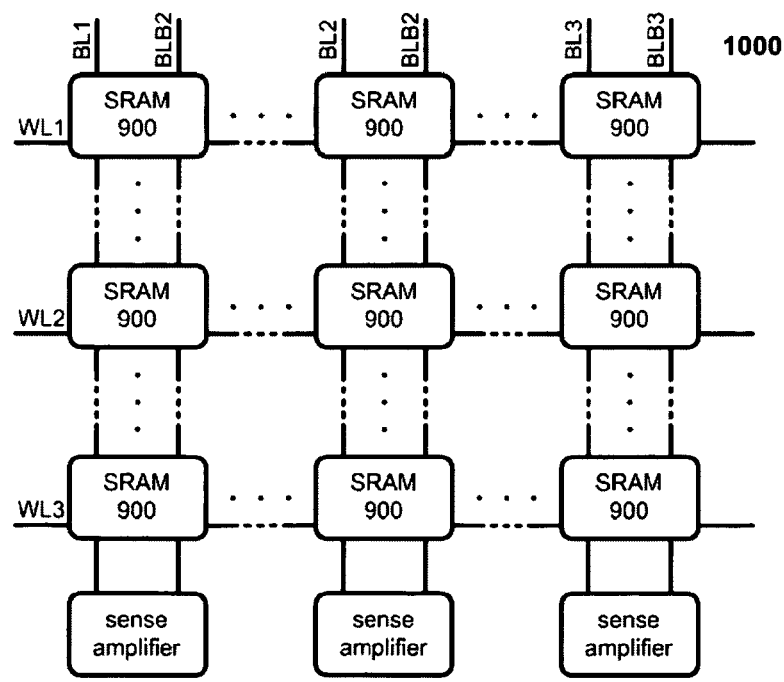
FIG. 10: SRAM array implemented with SER robust SRAM cells using the proposed SER robust storage cell.

Referring to FIG. 10, a sample array of SRAM cells 900 is illustrated generally by numeral 1000. The array 1000 comprises M rows and N columns of SRAM cells 900. A bitline pair BL and BLB is shared among the cells located in a given column. A wordline WL is shared among all cells in a given row. In addition to the array 1000, a memory will also contain blocks such as address decoders, timing and control, sensing and column drivers. These blocks are similar to those found in state-of-the-art SRAM configurations, and therefore are not described in detail. Alternatively, the bitline pair BL and BLB may be shared among the cells located in a given row and the wordline WL may be shared among all cells in a given column.

Figure 11:
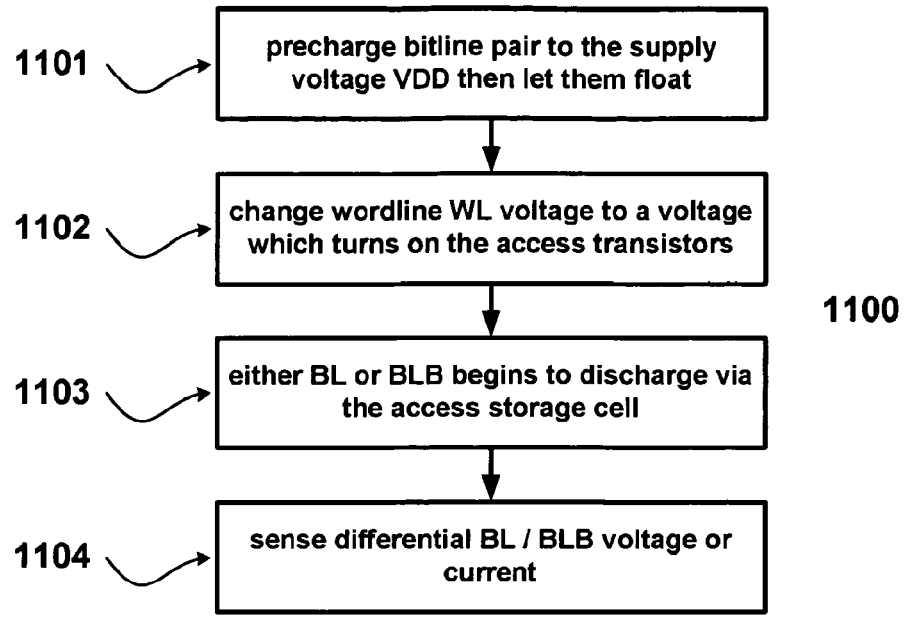
FIG. 11: Read operation on a SER robust SRAM cell using the proposed storage cell.

Referring to FIG. 11 the read operation on the 8T SRAM cell 900 is illustrated generally by numeral 1100. In the present embodiment, it is assumed that the supply voltage VDD is 1V, the initial voltage at nodes A and C is 1V value and the initial voltage at nodes B and D is 0V. Thus, the cell 1100 stores a logic 1.

At step 1101, the differential bitline pair BL and BLB are pre-charged to 1V. After the precharge is complete the bitline pair BL and BLB are electrically disconnected from all devices and the voltage is held by way of the parasitic capacitance of the bitlines.

At step 1102, the wordline WL voltage is changed so as to turn on the access transistors. In this embodiment using SRAM cell 900 the WL is raised to 1V so as to enable the NMOS access transistors.

There is now no voltage difference across transistor N5 in the SRAM cell 900 and as such no current will flow. However, there is now a voltage difference across transistor N6 in the SRAM cell 900 which is turned on. The voltage on BLB is VDD whereas the voltage at node B is GND. As such at step 1103 the voltage on BLB will begin to discharge through node B in the storage cell 700.

At step 1104, either the current resulting from the read operation, or the resulting differential voltage across the bitlines, is sensed by a sense amplifier (not shown).

Since the cell is differential, the read operation will be similar when the stored value is reversed and the initial voltage at nodes A and C is 0V value and the initial voltage at nodes B and D is 1V. However, in such an embodiment node the voltage on BL would be zero and as such the BL would be discharged, as opposed to BLB.

It will be appreciated that the logic state of a cell can be determined by examining the bitline pair BL or BLB is at the end of the read operation.

Figure 12:
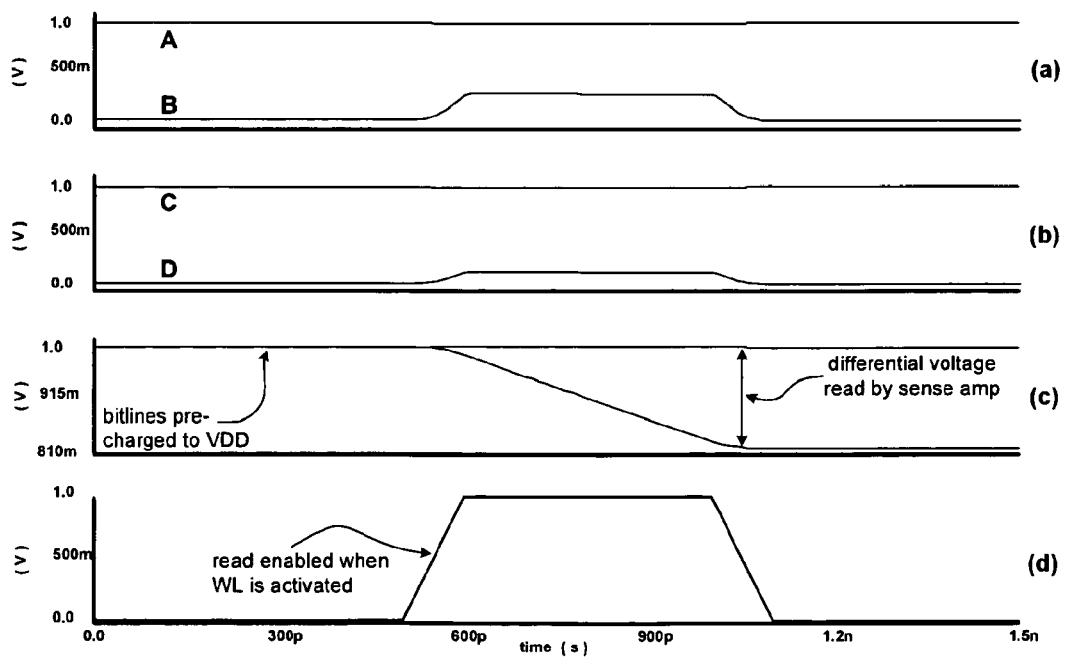
FIG. 12: Simulation waveforms illustrating a read operation on a SER robust SRAM cell using the proposed storage cell.

An example of a read operation when a logic 1 is stored in the SRAM cell 900 will be described with reference to the timing diagrams illustrated in FIG. 12. As illustrated in FIG. 12*d*, the read operation begins when the signal WL is raised from GND to VDD. As illustrated in FIG. 12*c*, the read operation results in the voltage BLB decreasing as it is discharged through the storage cell creating the differential voltage across the bitline pair BL and BLB detected by the sense amplifier. As illustrated in FIG. 12*a* and FIG. 12*b*, the internal nodes of the storage cell 700 do not change state, hence the read operation is non-destructive.

Figure 13:
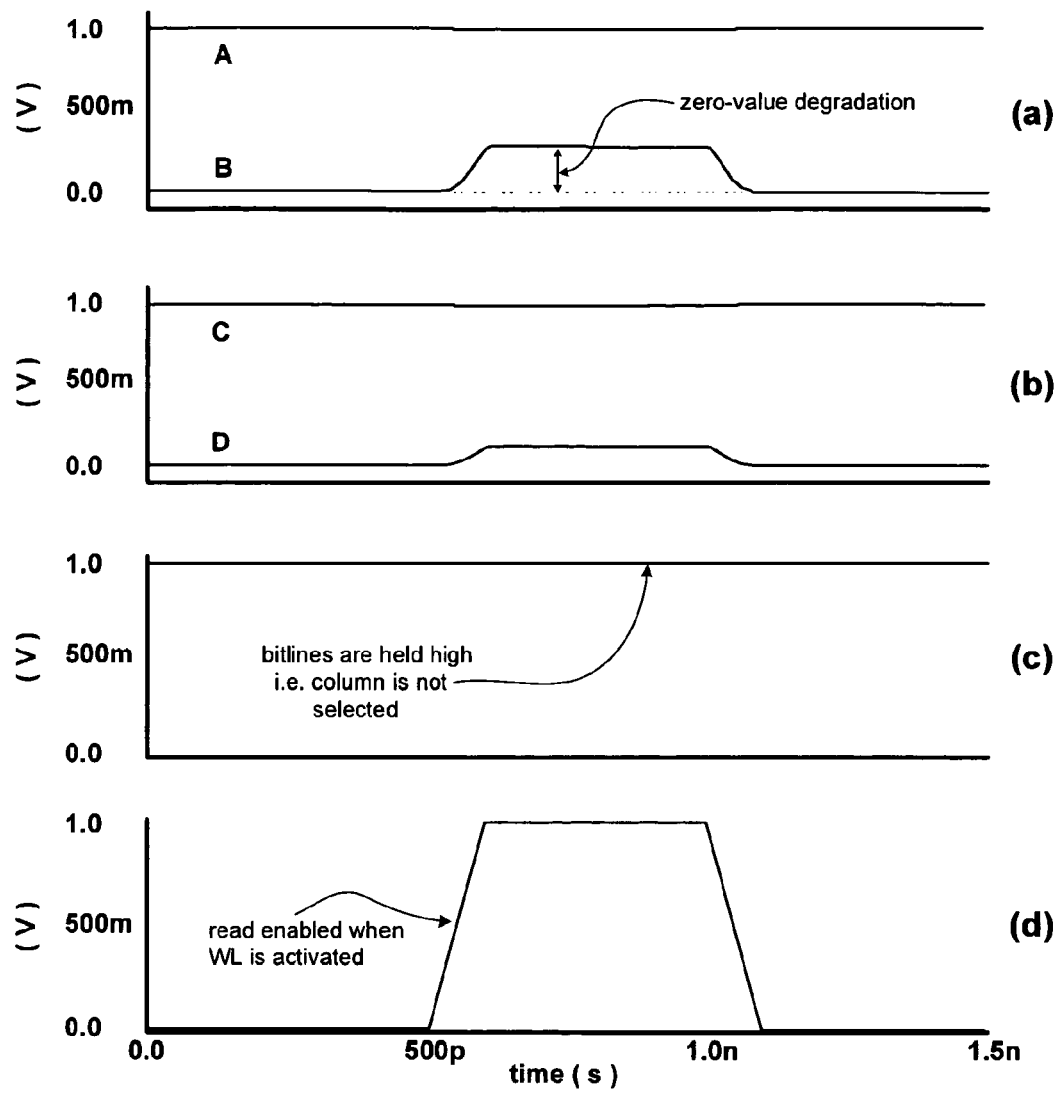
FIG. 13: Simulation waveforms illustrating a half-selected SER robust SRAM cell using the proposed storage cell.

Referring to FIG. 13 an example of a SRAM cell 900 which is not being read, but which connected to the WL which is enabled. This causes the SRAM cell 900 to be half-selected. As illustrated in FIG. 13*d* the wordline WL is raised from GND to VDD for a period of time. However, as illustrated in FIG. 13*c* the bitlines BL and BLB are not left to float, but rather are held to VDD. As illustrated in FIG. 13*a* and FIG. 13*b* the internal nodes of the storage cell 700 are perturbed, but do not change stage.

Figure 14:
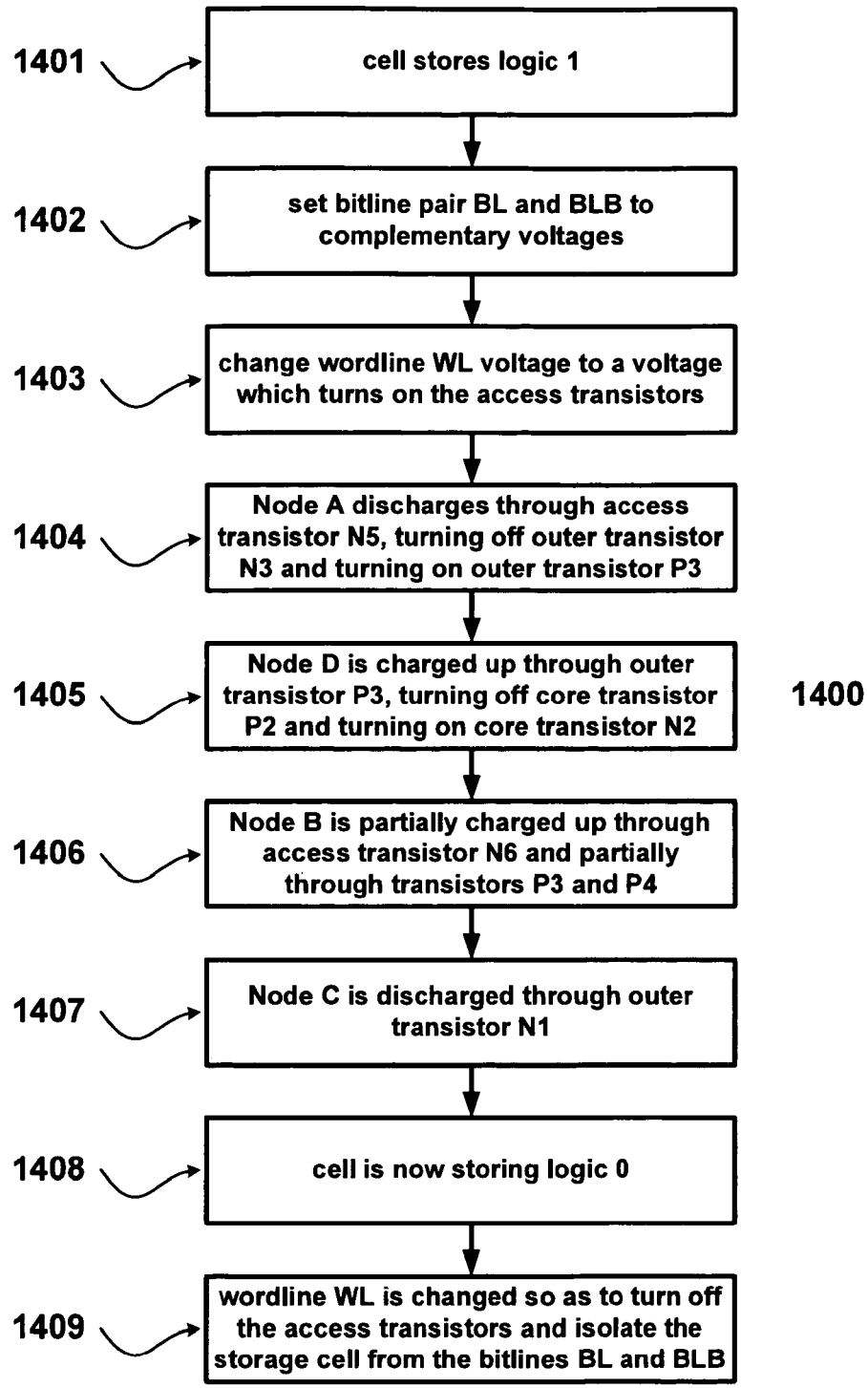
FIG. 14: Write operation on a SER robust SRAM cell using the proposed storage cell.

Referring to FIG. 14, a flow chart illustrating the steps for writing a logic 0 to the SRAM cell 900 is illustrated by numeral 1400. In this example, at step 1401 the initial state of the SRAM cell 900 is logic 1 so the initial voltage at nodes A and C is 1V and that the initial voltage at nodes B and D is 0V.

At step 1402 the bitline pair is set so that bitline BL is set to 0V and bitline BLB is set to 1V. At step 1403, the voltage on the wordline WL is changed to a voltage which turns on the access transistors in the SRAM cell 900.

At step 1404, the voltage at node A is logically high, however the voltage on the bitlines BL connected to node A via access transistor N5 is low. As such node A is discharged through the access transistors N5. This results in the outer transistor N3 turning off and outer transistor P3 turning on.

At step 1405, Node D is charged up through outer transistor P3, turning off core transistor P2 and turning on core transistor N2.

At step 1406, Node B is partially charged up through access transistor N6 and partially through transistors P3 and P4. Finally at step 1407 Node C is discharged through outer transistor N1.

At step 1408, the internal nodes of storage cell 700 are stable and the storage cell now stores a logic 0 state. At step 1409, the wordline WL is changed to a state which turns off the access transistor and isolates the storage cell 700 from the bitlines BL and BLB.

Since the cell is differential, writing a logic 1 to an SRAM cell 900 storing a logic 0 operates in a similar fashion to that described with reference to FIG. 14. However, in this example, the initial voltage at nodes A and C is 0V and that the initial voltage at nodes B and D is 1V. Accordingly, in order to write a logic 1 the bitline pair is set so that bitline BL is set to 1V and bitline BLB is set to 0V. Thus, when the voltage of the wordline WL is changed so as to turn on the access transistor the voltages of the storage cell will flip and the cell will store a logic 1 state.

Figure 15:
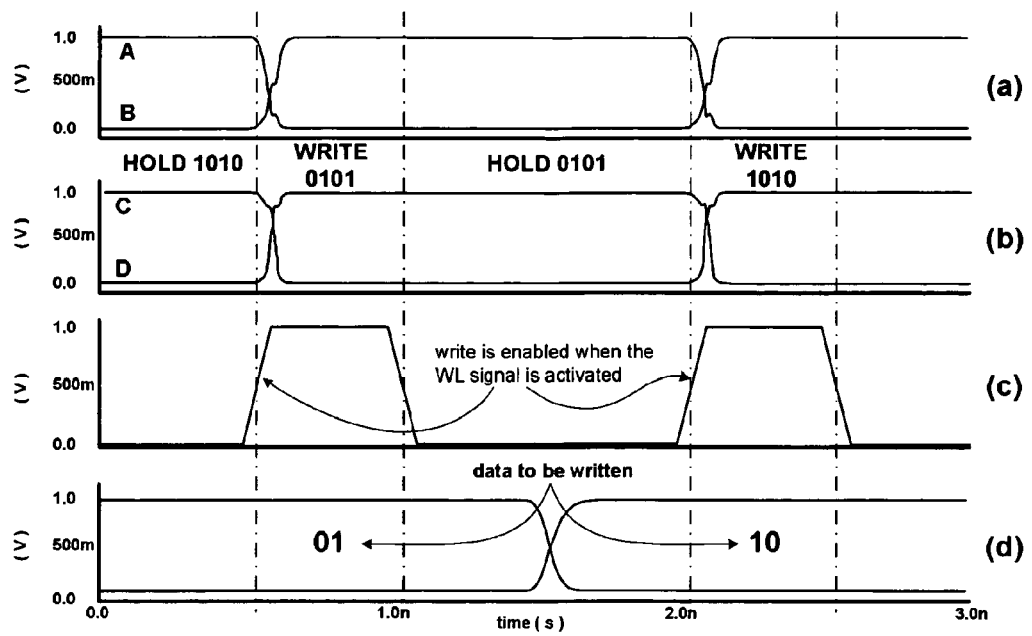
FIG. 15: Simulation waveforms illustrating a write operation on a SER robust SRAM cell using the proposed storage cell.

An example of a write operation on the SRAM cell 900 will be described with reference to the timing diagrams illustrated in FIG. 15. The initial state of the cell is logic 1. First a logic 0 will be written into the cell and then a logic 1 will be written into the cell. As illustrated in FIG. 15*d*, the state written into the storage cell depends on the complementary values on the bitlines BL and BLB. As illustrated in FIG. 15*c*, the write operation begins when the signal WL is raised from GND to VDD. As illustrated in FIG. 15*a* and FIG. 15*b*, the internal storage nodes of the storage cell are changed during a write operation in such a way that the cell stores the desired state.

Although the previous embodiments have been described with a particular configuration of storage node voltages for logic 1 and complementary voltages for logic 0, it will be appreciated that the inverse may also be the case. That is, a storage node configuration described as logic 1 could, instead, be defined as logic 0, and vice versa.

Figure 16:
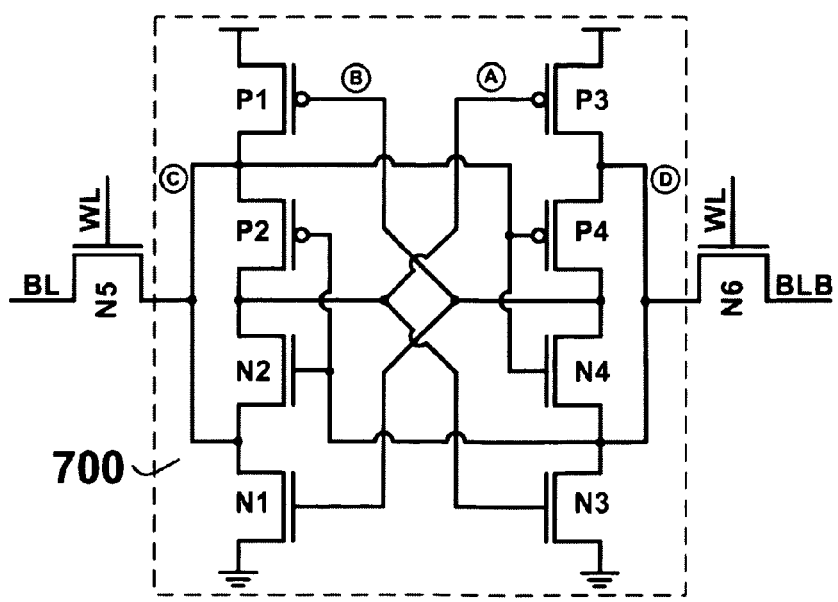
FIG. 16: Alternate SER robust SRAM cell utilizing the proposed storage cell but connecting to nodes C and D.
Figure 17:
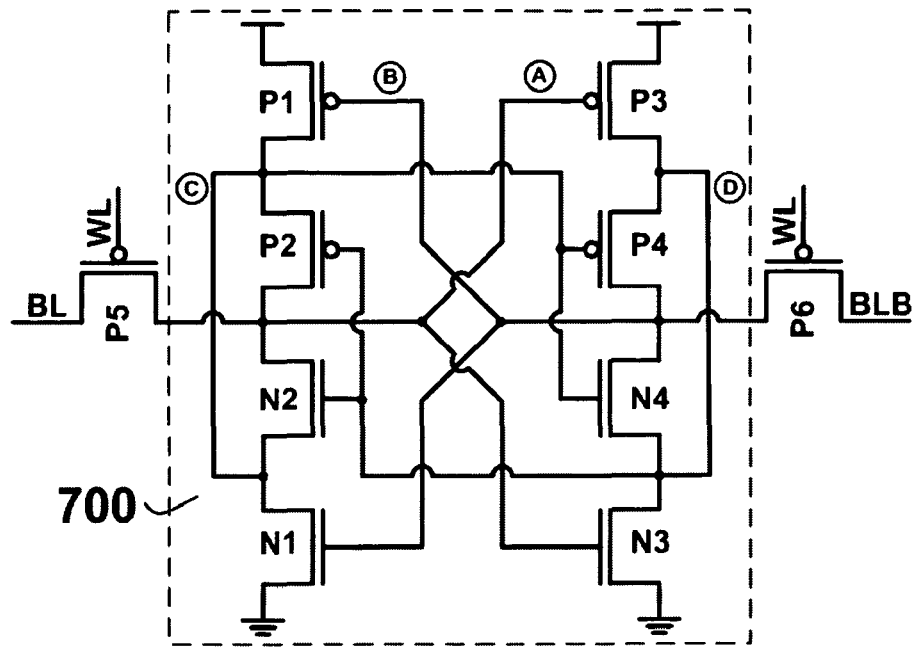
FIG. 17: Alternate SER robust SRAM cell utilizing the proposed storage cell however connecting to nodes A and B via PMOS access transistors.
Figure 18:
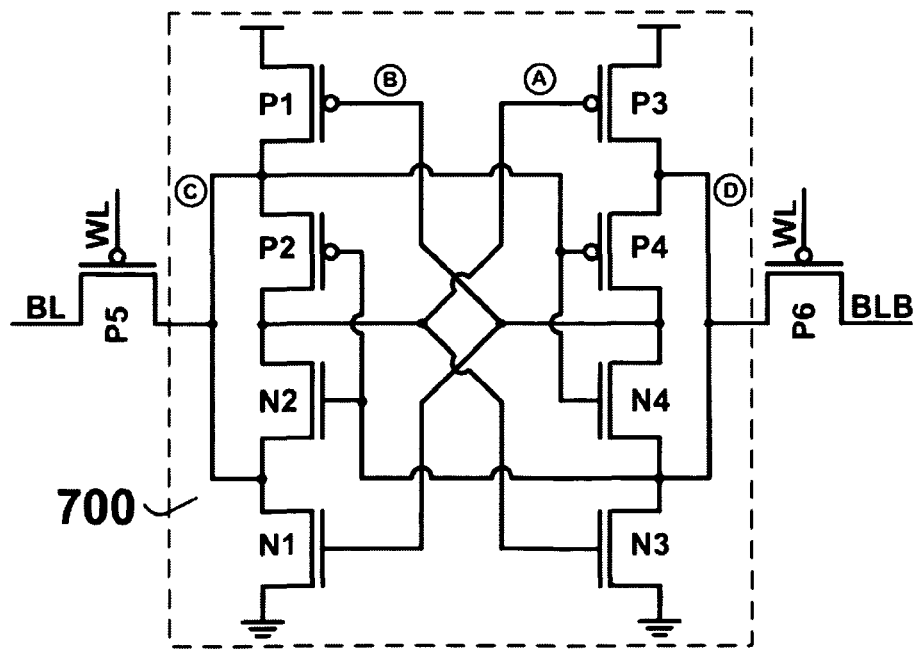
FIG. 18: Alternate SER robust SRAM cell utilizing the proposed storage cell however connecting to nodes C and D via PMOS access transistors.

Further, although the previous embodiment of the SRAM cell 900 had NMOS access transistors accessing nodes A and B of a storage cell 700 it will be appreciated that alternative embodiments are possible. Referring to FIG. 16 one alternate SRAM cell embodiment is illustrated. In this embodiment an SRAM cell is created by accessing a storage cell 700 using two NMOS access transistors which couple storage cell 700 nodes C and D to BL and BLB respectively. Referring to FIG. 17 a second alternate SRAM cell embodiment is illustrated. In this embodiment an SRAM cell is created by accessing a storage cell 700 using two PMOS access transistors which couple storage cell 700 nodes A and B to BL and BLB respectively. Referring to FIG. 18 a third alternate SRAM cell embodiment is illustrated. In this embodiment an SRAM cell is created by accessing a storage cell 700 using two PMOS access transistors which couple storage cell 700 nodes C and D to BL and BLB respectively. It will be understood by those skilled in the art that these SRAM cells perform the identical functionality as described in the first embodiment SRAM cell 900.

Figure 19:
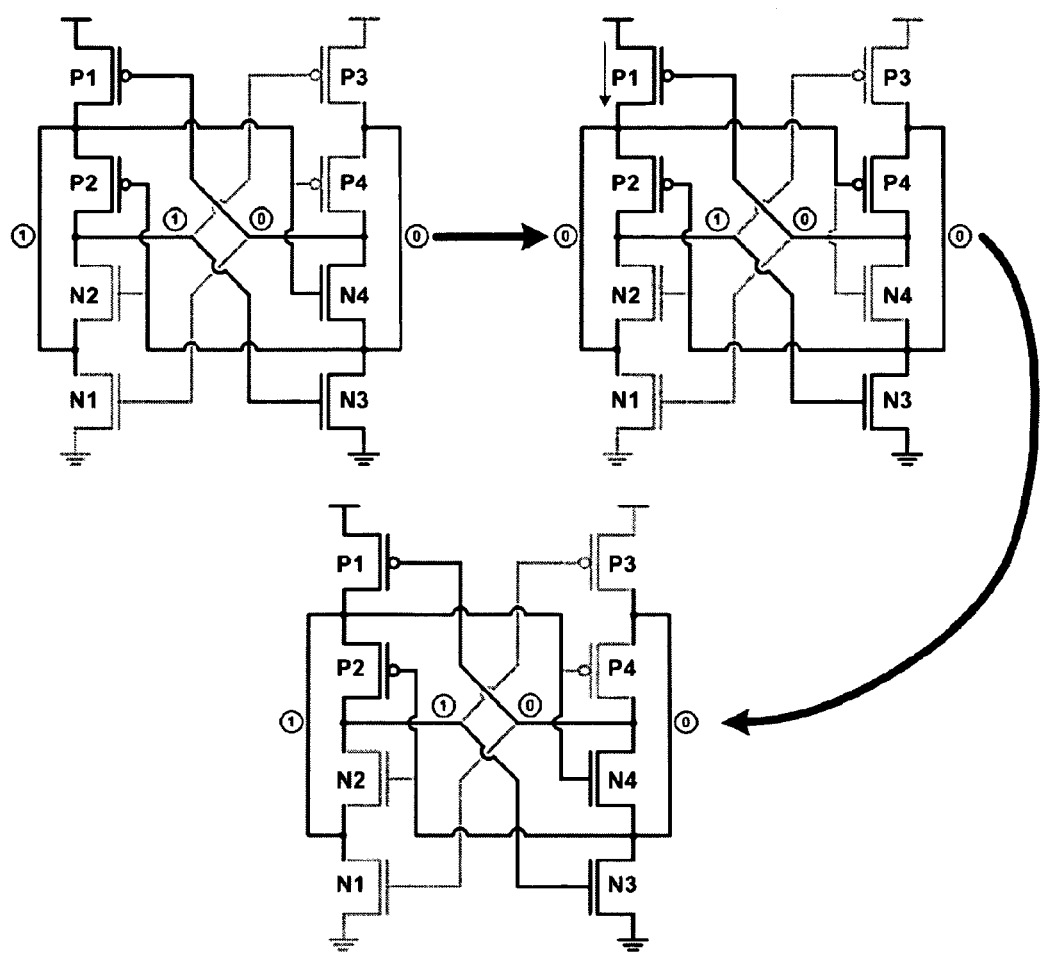
FIG. 19: Response of the proposed storage cell to a soft error induced upset on node A.

While the SRAM cell 900 can be written into via differential access transistors, the storage cell 700 is resistance to single ended stresses, and as such is robust to soft-errors. The response of the proposed storage cell 700 to a particle strike on node A is shown in FIG. 19. The initial logical state at nodes A and C is 1 value and the initial logical state at nodes B and D is 0. Initially transistors P1, P2, N3 and N4 are on, and transistors N1, N2, P3 and P4 are off. The charge collected by the particle strike causes the state of node C to flip, such that it is now at a logical 0 state. This has the effect of turning off transistor N4 and turning on transistor P4. However, this does not result in any other node changing state. The current from P1 will eventually charge Node C to a logical state 1 returning the storage cell to its original state.

Figure 20:
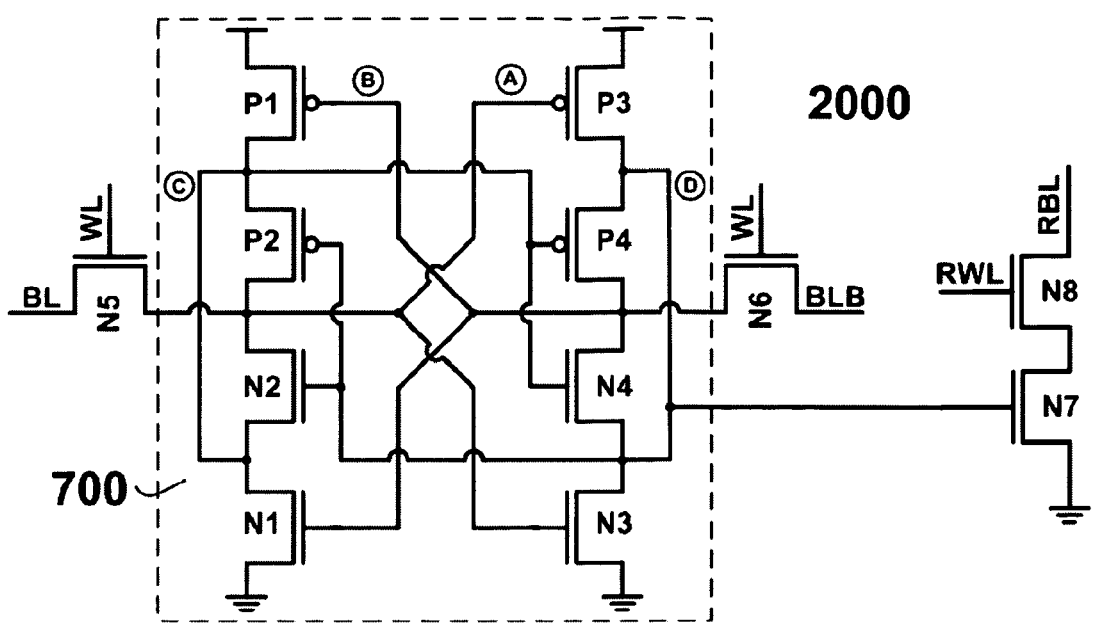
FIG. 20: Schematic diagrams showing a register file memory cell with one write port and one read port.

The proposed storage cell can be used to implement a register file memory cell. Referring to FIG. 20, a sample register file memory cell which utilizes the storage cell 700 is illustrated generally by numeral 2000. The addition of transistors N7 and N8 along with signals RBL and RWL create a single read port. It will be understood by those skilled in the art that it is trivial to increase the number of read or write ports to register file memory cell 2000.

Figure 21:
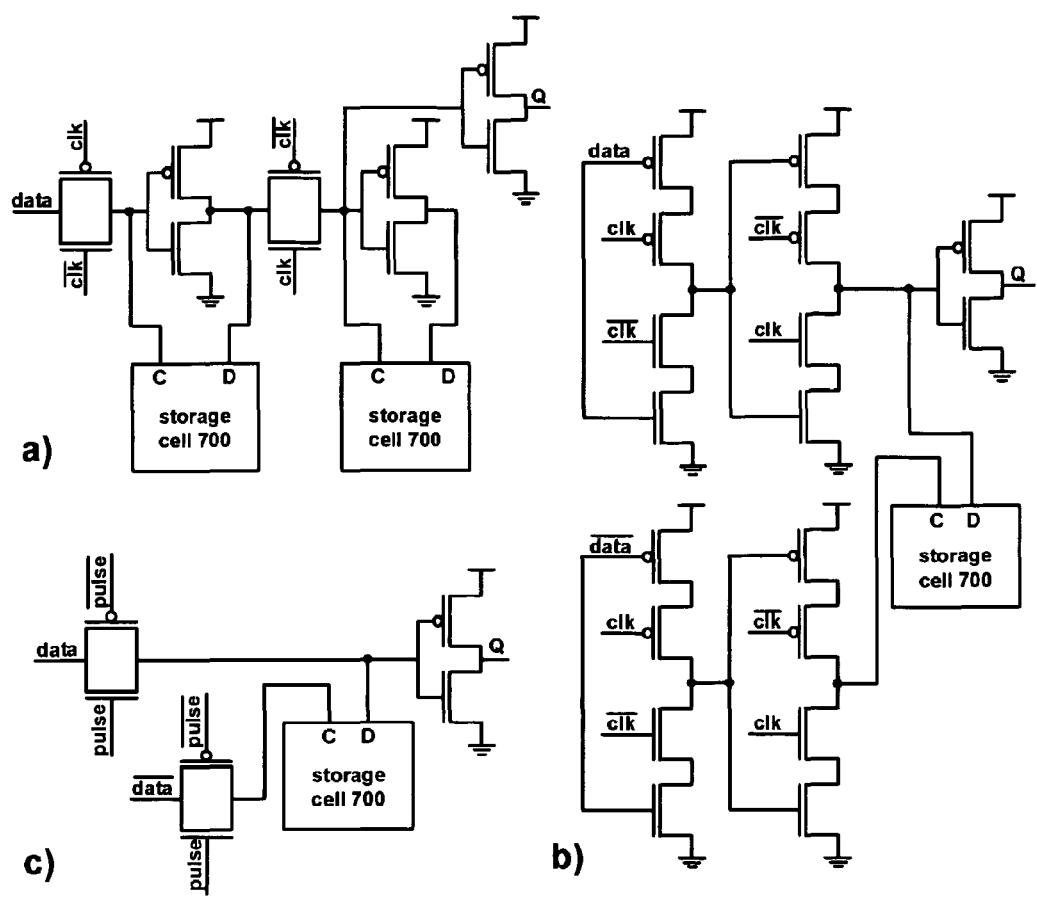
FIG. 21: Schematic diagrams showing three possible flip-flop circuits utilizing the proposed SER robust storage cell.

In logic storage cells are an integral part of flip-flops, and as such the proposed storage cell 700 can be used in a variety of flip-flop designs. Referring to FIG. 21 several sample embodiments of flip-flops are shown which are implemented using the proposed storage cell 700. FIG. 21a illustrates a flip-flop with a master-slave DFF architecture which utilizes the storage cell 700. FIG. 21b illustrates a flip-flop with a C2MOS architecture which utilizes the storage cell 700. FIG. 21c illustrates a flip-flop with a pulsed-latch architecture which utilizes the storage cell 700. While the figures show the various transfer gates accessing the storage cell 700 via nodes C and D, the storage cell 700 could also be access via nodes A and B instead.

It will be understood by those skilled in the art that these are not an exhaustive list of flip-flops which can be implemented using the storage cell 700. A flip-flop can be created using any transfer gate which passes the input data signals to the storage cell 700 gated appropriately by a clock signal.

Further, although preferred embodiments of the invention have been described herein, it will be understood by those skilled in the art that variations may be made thereto without departing from the spirit of the invention or the scope of the appended claims.

What is claimed is:

1. A circuit comprising:
 a first NMOS transistor, a second NMOS transistor, a third NMOS transistor, a fourth NMOS transistor, a first PMOS transistor, a second PMOS transistor, a third PMOS transistor, a fourth PMOS transistor, a first node, a second node, a third node, and a fourth node, wherein:
 a drain of the first NMOS transistor and a drain of the first PMOS transistor are electrically connected to the third node;
 a drain of the second NMOS transistor and a drain of the second PMOS transistor are electrically connected to the first node;
 a drain of the third NMOS transistor and a drain of the third PMOS transistor are electrically connected to the fourth node;
 a drain of the fourth NMOS transistor and a drain of the fourth PMOS transistor are electrically connected to the second node;
 a gate of the first NMOS transistor and a gate of the first PMOS transistor are electrically connected to the second node;
 a gate of the second NMOS transistor and a gate of the second PMOS transistor are electrically connected to the fourth node;
 a gate of the third NMOS transistor and a gate of the third PMOS transistor are electrically connected to the first node;
 a gate of the fourth NMOS transistor and a gate of the fourth PMOS transistor are electrically connected to the third node;
 a source of the second NMOS transistor and a source of the second PMOS transistor are electrically connected to the third node; and
 a source of the fourth NMOS transistor and a source of the fourth NMOS transistor are electrically connected to the fourth node.

2. The circuit of claim 1, wherein:
 a source of the first NMOS transistor and a source of the third NMOS transistor are electrically connected to ground; and
 a source of the first PMOS transistor and a source of the third PMOS transistor are electrically connected to a power supply bus.

3. The circuit of claim 1, further comprising:
 a first access transistor configured to selectively electrically connect the first node to a bitline; and
 a second access transistor configured to selectively electrically connect the second node to a complementary bitline.

4. The circuit of claim 3, wherein:
 the first access transistor comprises an NMOS transistor; and
 the second access transistor comprises an NMOS transistor.

5. The circuit of claim 3, wherein:
 the first access transistor comprises a PMOS transistor; and
 the second access transistor comprises a PMOS transistor.

6. The circuit of claim 3, wherein a gate of the first access transistor and a gate of the second access transistor are electrically connected to a fifth node.

7. The circuit of claim 1, further comprising:
 a first access transistor configured to selectively electrically connect the third node to a bitline; and
 a second access transistor configured to selectively electrically connect the fourth node to a complementary bitline.

8. The circuit of claim 7, wherein:
 the first access transistor comprises an NMOS transistor; and
 the second access transistor comprises an NMOS transistor.

9. The circuit of claim 7, wherein:
 the first access transistor comprises a PMOS transistor; and
 the second access transistor comprises a PMOS transistor.

10. The circuit of claim 7, wherein a gate of the first access transistor and a gate of the second access transistor are electrically connected to a fifth node.

11. A circuit comprising:
 a plurality of storage cells, wherein each storage cell comprises a first NMOS transistor, a second NMOS transistor, a third NMOS transistor, a fourth NMOS transistor, a first PMOS transistor, a second PMOS transistor, a third PMOS transistor, a fourth PMOS transistor, a first access transistor, a second access transistor, a first node, a second node, a third node, a fourth node, and a fifth node, wherein for each storage cell:
 a drain of the first NMOS transistor and a drain of the first PMOS transistor are electrically connected to the third node;
 a drain of the second NMOS transistor and a drain of the second PMOS transistor are electrically connected to the first node;

a drain of the third NMOS transistor and a drain of the third PMOS transistor are electrically connected to the fourth node;
a drain of the fourth NMOS transistor and a drain of the fourth PMOS transistor are electrically connected to the second node;
a gate of the first NMOS transistor and a gate of the first PMOS transistor are electrically connected to the second node;
a gate of the second NMOS transistor and a gate of the second PMOS transistor are electrically connected to the fourth node;
a gate of the third NMOS transistor and a gate of the third PMOS transistor are electrically connected to the first node;
a gate of the fourth NMOS transistor and a gate of the fourth PMOS transistor are electrically connected to the third node;
a source of the second NMOS transistor and a source of the second PMOS transistor are electrically connected to the third node;
a source of the fourth NMOS transistor and a source of the fourth NMOS transistor are electrically connected to the fourth node;
the first access transistor is configured to selectively electrically connect the first node or the third node to a bitline;
a second access transistor configured to selectively electrically connect the second node or the fourth node to a complementary bitline; and
a gate of the first access transistor and a gate of the second access transistor are electrically connected to the fifth node.

12. The circuit of claim 11, wherein:
the plurality of storage cells are arranged in a matrix of rows and columns;
each of the plurality of storage cells in a given column share the bitline and the complementary bitline; and
each of the plurality of storage cells in a given column do not share the fifth node.

13. The circuit of claim 11, wherein:
the plurality of storage cells are arranged in a matrix of rows and columns;
each of the plurality of storage cells in a given row do not share the bitline and the complementary bitline; and
each of the plurality of storage cells in a given row share the fifth node.

14. The circuit of claim 11, wherein:
the plurality of storage cells are arranged in a matrix of rows and columns;
each of the plurality of storage cells in a given column share the bitline and the complementary bitline;
each of the plurality of storage cells in a given column do not share the fifth node;
each of the plurality of storage cells in a given row do not share the bitline and the complementary bitline; and
each of the plurality of storage cells in a given row share the fifth node.

15. A circuit comprising:
a flip-flop including a storage cell, wherein the storage cell comprises a first NMOS transistor, a second NMOS transistor, a third NMOS transistor, a fourth NMOS transistor, a first PMOS transistor, a second PMOS transistor, a third PMOS transistor, a fourth PMOS transistor, a first node, a second node, a third node, and a fourth node, wherein:

a drain of the first NMOS transistor and a drain of the first PMOS transistor are electrically connected to the third node;
a drain of the second NMOS transistor and a drain of the second PMOS transistor are electrically connected to the first node;
a drain of the third NMOS transistor and a drain of the third PMOS transistor are electrically connected to the fourth node;
a drain of the fourth NMOS transistor and a drain of the fourth PMOS transistor are electrically connected to the second node;
a gate of the first NMOS transistor and a gate of the first PMOS transistor are electrically connected to the second node;
a gate of the second NMOS transistor and a gate of the second PMOS transistor are electrically connected to the fourth node;
a gate of the third NMOS transistor and a gate of the third PMOS transistor are electrically connected to the first node;
a gate of the fourth NMOS transistor and a gate of the fourth PMOS transistor are electrically connected to the third node;
a source of the second NMOS transistor and a source of the second PMOS transistor are electrically connected to the third node; and
a source of the fourth NMOS transistor and a source of the fourth NMOS transistor are electrically connected to the fourth node.

16. The circuit of claim 15, wherein the flip-flop comprises a master-slave D-flip-flop architecture.

17. The circuit of claim 15, wherein the flip-flop comprises a C2MOS architecture.

18. The circuit of claim 15, wherein the flip-flop comprises a pulsed-latch architecture.

19. A circuit comprising:
a storage cell including:
a first core storage node and a second core storage node configured to store complementary voltages;
a first outer storage node and a second outer storage node configured to:
limit feedback between the first core storage node and the second core storage node; and
restore an original value on the first core storage node or the second core storage node in an event of a soft error;
a first core drive transistor configured to selectively electrically connect the first core storage node to the first outer storage node;
a second core drive transistor configured to selectively electrically connect the second core storage node to the second outer storage node;
a first core load transistor configured to selectively electrically connect the first core storage node to the first outer storage node;
a second core load transistor configured to selectively electrically connect the second core storage node to the second outer storage node;
a first outer drive transistor configured to selectively electrically connect the first outer storage node to ground;
a second outer drive transistor configured to selectively electrically connect the second outer storage node to ground;
a first outer load transistor configured to selectively electrically connect the first outer storage node to a power supply bus; and a second outer load transistor configured to selectively electrically connect the second outer storage node to a power supply bus.

20. The circuit of claim 19, further comprising:
a first access transistor configured to selectively electrically connect the first core storage node with a bitline; and
a second access transistor configured to selectively electrically connect the second core storage node with a complementary bitline;
wherein:
   a wordline is electrically connected to a gate of the first access transistor and a gate of the second access transistor; and
   the first access transistor and the second access transistor operate in a complementary manner to read data from and write data to the storage cell.

21. The circuit of claim 20, further comprising a plurality of the storage cells, and wherein:
the bitline and complementary bitline electrically connect a portion of the plurality of the storage cells in a column; and
the wordline electrically connects the first access transistor and the second access transistor of a portion of the plurality of the storage cells in a row.

22. The circuit of claim 19, further comprising:
a flip-flop including a transfer circuit configured to receive a data signal and a clock signal, wherein the transfer circuit is electrically connected to the storage cell; and
a buffer circuit electrically connected to the storage cell;
wherein the transfer circuit includes:
   a plurality of input nodes configured to receive the data signal and the clock signal;
   a first output node configured to provide a sampled data signal in response to the clock signal and the data signal;
   a second output node configured to provide a sampled inverse data signal complementary to the sampled data signal in response to the clock signal and the data signal; and
wherein the storage cell is configured to hold data during a period of the clock signal while the storage cell is decoupled from the input nodes.

23. The circuit of claim 22, wherein:
the transfer circuit further comprises first and second clock-controlled parallel paths;
each of the first and second clock-controlled parallel paths is configured to receive the data signal and the clock signal; and
each of the first and second clock-controlled parallel paths includes an output coupled to a corresponding one of the first and second output nodes to provide the sampled data signal and the sampled inverse data signal.

24. The circuit of claim 23, wherein the first and second clock-controlled parallel paths are independent from one another.

25. The circuit of claim 22, further comprising a digital logic circuit including the flip-flop.

* * * * *